United States Patent
Kuhara et al.

[19]

[11] Patent Number: 5,999,001
[45] Date of Patent: Dec. 7, 1999

[54] GRADIENT MAGNETIC FIELD GENERATION APPARATUS FOR A MAGNETIC RESONANCE IMAGING APPARATUS

[75] Inventors: Shigehide Kuhara; Kiyomi Mori; Masaaki Yamanaka, all of Otawara, Japan

[73] Assignee: Kabushiki Kaisha Toshiba, Kawasaki, Japan

[21] Appl. No.: 08/907,620

[22] Filed: Aug. 8, 1997

[30] Foreign Application Priority Data

Aug. 9, 1996 [JP] Japan ................................. 8-211152

[51] Int. Cl.$^6$ ........................................ G01V 3/00
[52] U.S. Cl. ............................ 324/322; 324/314
[58] Field of Search .................... 324/322, 318, 324/314, 312, 307, 309, 300; 600/421

[56] References Cited

U.S. PATENT DOCUMENTS

| | | |
|---|---|---|
| 4,733,342 | 3/1988 | Mueller et al. ............... 324/322 |
| 5,105,153 | 4/1992 | Mueller et al. . |
| 5,245,287 | 9/1993 | Nowak et al. . |
| 5,270,657 | 12/1993 | Wirth et al. . |
| 5,451,878 | 9/1995 | Wirth et al. ............... 324/322 |
| 5,663,647 | 9/1997 | Wirth et al. ............... 324/322 |

*Primary Examiner*—Louis Arana
*Attorney, Agent, or Firm*—Oblon, Spivak, McClelland, Maier & Neustadt, P.C.

[57] ABSTRACT

A gradient magnetic field generation apparatus according to the present invention comprises a gradient coil, an assistant voltage selector for generating first and second control signals in accordance with an input waveform signal, the first control signal being the same as or similar to, the input waveform signal, a delay circuit for delaying the first control signal for a first delay time, a delay circuit for delaying the second control signal for a second delay time, a main power for amplifying the delayed first control signal and applying a voltage to a gradient coil, an assistant power for generating an assistant voltage for assisting the main power in accordance with the delayed second control signal, and a delay controller for individually controlling the first and second delay times.

23 Claims, 15 Drawing Sheets

|  | SW1 | SW2 | SW3 | SW4 | SW5 | SW6 | SW7 | SW8 | SW9 | SW10 | SW11 | SW12 | ASSISTANT VOLTAGE(V) |
|---|---|---|---|---|---|---|---|---|---|---|---|---|---|
| B MODE(+) | O |  |  |  |  |  | O | O | O | O |  | O | +500 |
| B MODE(-) |  | O |  |  |  |  | O | O | O | O | O |  | -500 |
| C MODE(+) |  |  | O | O |  | O |  | O |  |  |  |  | +1000 |
| C MODE(-) |  |  | O | O | O | O | O |  |  |  |  |  | -1000 |
| D MODE(+) |  |  | O |  | O | O | O | O |  | O |  |  | +1500 |
| D MODE(-) |  |  |  | O | O | O | O | O | O |  |  |  | -1500 |
| E MODE(+) |  |  |  |  | O | O | O | O |  | O |  | O | +2000 |
| E MODE(-) |  |  |  | O | O | O | O | O | O |  | O |  | -2000 |
| F MODE(+) | O |  | O |  | O | O | O | O | O |  |  |  | +2500 |
| F MODE(-) |  | O | O | O | O | O | O | O |  | O |  |  | -2500 |
| G MODE(+) | O |  | O |  |  | O | O | O | O | O |  | O | +3000 |
| G MODE(-) |  | O |  | O | O | O | O |  | O |  | O |  | -3000 |

O : ON    BLANK : OFF

A MODE : NOT ASSISTED (SW7 TO SW12 : ON)
B MODE : ASSISTED UNDER HV1 ONLY (+500V, -500V)
C MODE : ASSISTED UNDER HV2 ONLY (+1000V, -1000V)
D MODE : ASSISTED UNDER HV3 ONLY (+1500V, -1500V)
E MODE : ASSISTED UNDER HV1 AND HV3 (+2000V, -2000V)
F MODE : ASSISTED UNDER HV2 AND HV3 (+2500V, -2500V)
G MODE : ASSISTED UNDER HV1, HV2 AND HV3 (+3000V, -3000V)

FIG.10

B MODE (+)
(+500V)

C MODE (+)
(+1000V)

D MODE (+)
(+1500V)

E MODE (+)
(+2000V)

F MODE (+)
(+2500V)

G MODE (+)
(+3000V)

SECTION (1)

SECTION (2)

SECTION (3)

SECTION (4)

SECTION (5)

SECTION (6)

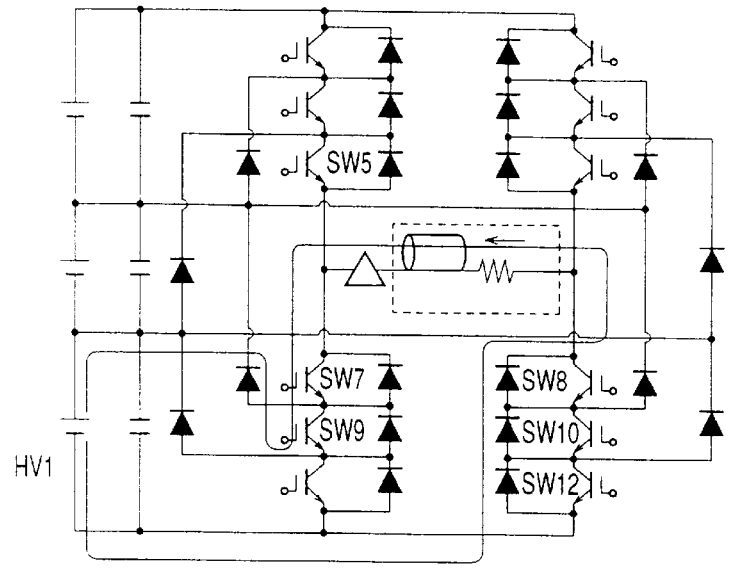
SECTION (7)
FIG.29　HV1
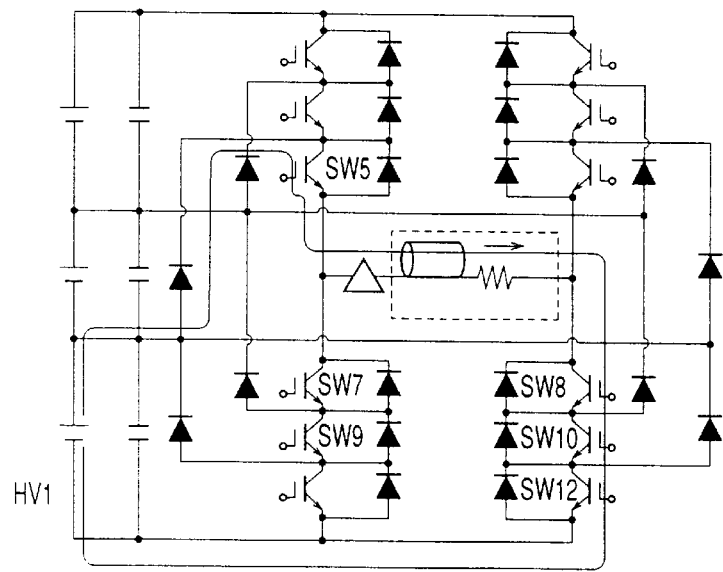
SECTION (8)
FIG.30　HV1
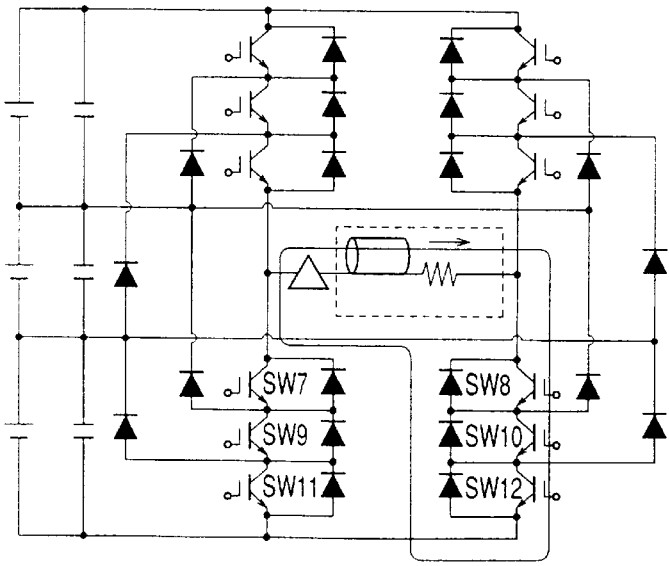
SECTION (9)
FIG.31

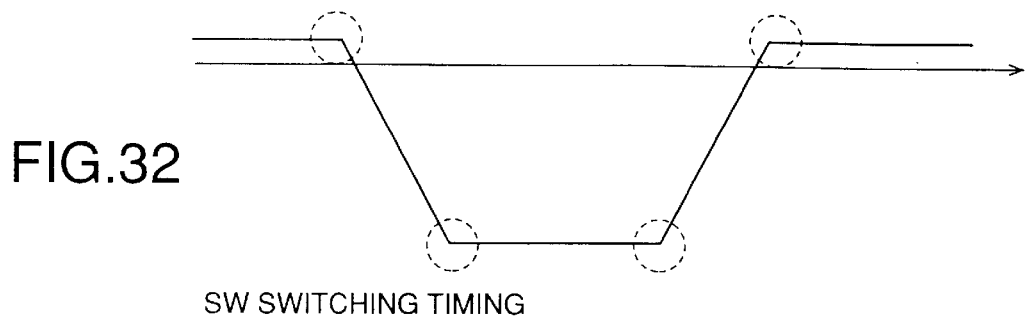
FIG.32
SW SWITCHING TIMING
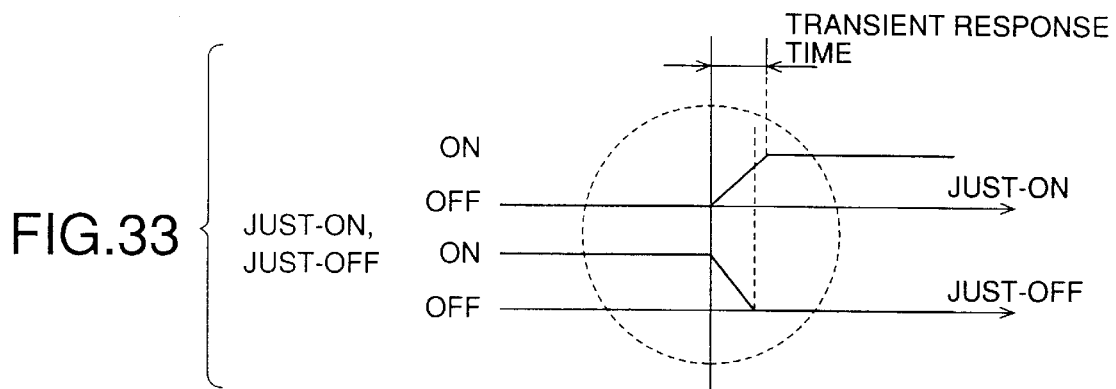
FIG.33 { JUST-ON, JUST-OFF
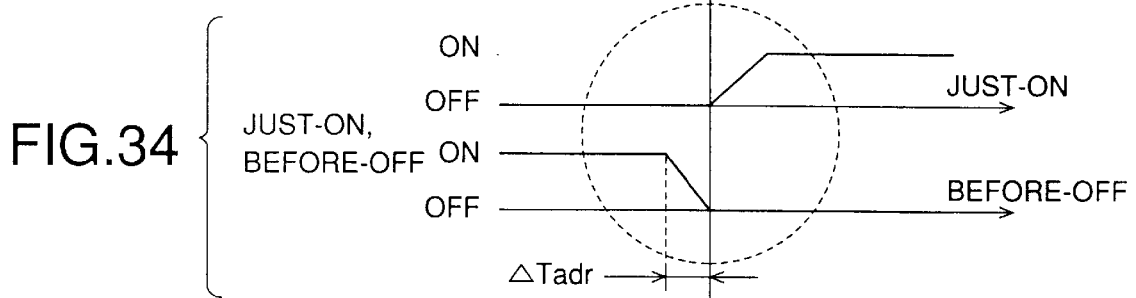
FIG.34 { JUST-ON, BEFORE-OFF
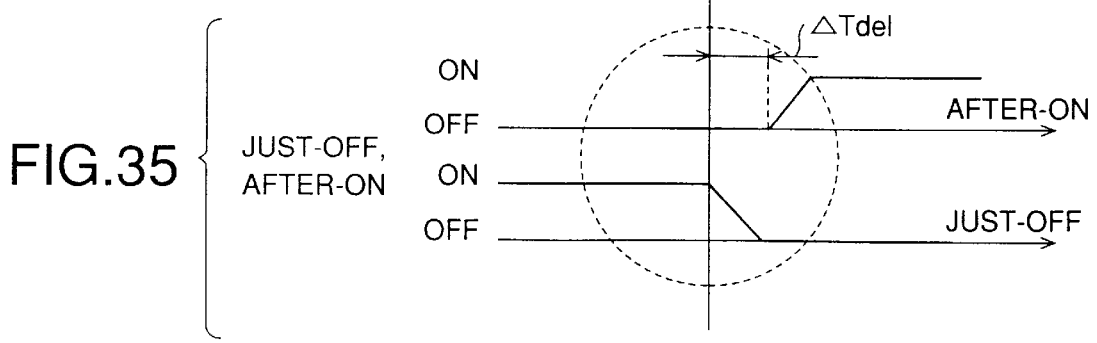
FIG.35 { JUST-OFF, AFTER-ON

GRADIENT MAGNETIC FIELD GENERATION APPARATUS FOR A MAGNETIC RESONANCE IMAGING APPARATUS

BACKGROUND OF THE INVENTION

The present invention relates to a gradient magnetic field generation apparatus adapted for use in an magnetic resonance imaging apparatus and generating a gradient magnetic field for spatially sloping a magnetic field intensity.

In recent years, a very high speed imaging method typical of an EPI (Echo Planar Imaging) method has being put to practical use. Here, the problem with the method is that it is difficult to enable a very strong gradient magnetic field to rise or decay at a very high speed. It is required that, for example, the EPI method, being compared with an ordinary spin echo method, have its magnetic field intensity increased by a factor of 2 to 3 and its rise time shortened by about 1/3 to 1/10.

In order to meet these requirements, an assistant power is used as shown in FIGS. 1 to 4. During a rise period, the main power, together with an assistant power, sharply raises the magnetic field.

In addition to this method, a method is also designed to raise the gradient magnetic field through the utilization of the resonance of a high frequency coil and capacitor. This method can raise the gradient magnetic field with a waveform approximate to a sinusoidal or spiral waveform.

Here, as the gradient magnetic field rising method use is made of a constant slew rate control method for enabling a rise to be achieved at a constant slope as shown in FIG. 5 and a constant rise time control method for achieving a rise at a constant time as shown in FIG. 6. The constant rise time control is characterized in that calculation, etc., becomes simpler at an oblique time but that a circuit arrangement becomes more complicated than the constant slew rate control method. That is, in order to effect constant slew rate control, the output voltage of the assistant power is not varied but, in order to effect constant rise time control, must be varied in accordance with a target coil current.

Thus, the apparatus of FIG. 1 cannot perform constant rise time control. As shown in FIG. 7, therefore, a plurality of assistant powers HV1, HV2 and HV3 are prepared and, through a combination with these assistant powers, a necessary assistant voltage is usually obtained.

In order to vary the assistant voltage to effect the constant rise time control, the problem arises as will be set out below.

1) It is necessary to initially determine the level of the assistant voltage required for the coil current to rise to a largest level with a given rise time. Further, when the level of the assistant voltage is to be determined in real-time, the starting of the assistant power will be delayed behind the main power by a time required for this calculation.

2) The delay time for electric current to actually flow through the gradient coil with respect to the input timing of an input waveform signal will vary, by the restricted frequency characteristic of the main power (linear amplifier), depending upon the assistant voltage.

3) The variation of the delay time in 2) becomes greater depending upon the variation of the response characteristics of a plurality of semiconductor switches for varying the arrangement of the circuit.

4) The switching of one of the semiconductor switches from ON to OFF and that of another semiconductor switch from OFF to ON are done while involving their transient responses of the order of a few microseconds. For this reason, if these switchings are done at a time, then the assistant power becomes dead shorted.

BRIEF SUMMARY OF THE INVENTION

A first object of the present invention is to eliminate the delay of a start of an assistant power relative to a main power.

A second object of the present invention is to eliminate a variation in delay time of a coil current resulting from a restricted frequency characteristic of a main power (linear amplifier).

A third object of the present invention is to eliminate a variation in delay time of a coil current resulting from a variation in transient response time of a semiconductor switch.

A fourth object of the present invention is to eliminate a dead shorting of an assistant power resulting from a transient response of a semiconductor switch.

A gradient magnetic field generation apparatus of the present invention comprising:

a gradient coil;

means for generating first and second control signals in accordance with the input waveform signal, the first control signal being the same as, or similar to, the input waveform signal;

a delay circuit for delaying the first control signal by a first delay time;

a delay circuit for delaying the second control signal by a second delay time;

a main power for amplifying the delayed first control signal and variably applying a voltage to the gradient coil;

an assistant power for generating an assistant voltage for assisting the main power in accordance with the delayed second control signal; and delay control means for individually controlling the first delay time and second delay time.

A gradient magnetic field generation apparatus of the present invention comprising:

a gradient coil;

a main power for variably applying a voltage to the gradient coil in accordance with the input waveform signal;

a plurality of assistant powers each generating an assistant voltage for assisting the main power, the assistant voltage being varied in a step-like manner in accordance with a corresponding combination with the assistant powers;

a plurality of switches provided for changing the combination of the assistant powers;

means for generating control signals for supply to the switches, there being a variation in the response times of the switches to the control signals; and at least one delay element provided at least one of the switches so as to compensate for the variation.

A gradient magnetic field generation apparatus of the present invention comprising:

a gradient coil;

a main power for variably applying a voltage to the gradient coil in accordance with the input waveform signal;

a plurality of assistant powers each generating an assistant voltage for assisting the main power, the assistant voltage being varied in a step-like manner in accordance with a combination of these assistant powers;

a plurality of switches provided for varying a combination of the assistant powers; and means for generating a plurality of control signals relative to the switches, the switches being placed in an OFF state when the control signal is at a first level and in an ON state when the control signal is at a second level, wherein when a first one of the plurality of switches is switched from an OFF to an ON state and a second switch is switched from an ON to OFF state in synchronism with the first switch, the control signal generating means delays a timing for changing the control signal relative to the first switch from a first to a second level behind a timing for changing the control signal relative to the second switch from the second level to the first level.

A gradient magnetic field generation apparatus of the present invention comprising:

a gradient coil;

a main power for variably applying a voltage to the gradient coil in accordance with an input waveform signal; and a plurality of assistant powers each generating an assistant voltage for assisting the main power; and a plurality of switches, wherein a circuit including the gradient coil, assistant powers and switches is so configured as to, through the changing of a combination of those ON switches, select an assistance and no assistance of the main power by the assistant powers, combination of those assistant powers assisting the main power and polarities of the assistant voltages.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, servo to explain the principles of the invention.

FIG. 10 is a view showing controllable output voltages of assistant powers;

FIG. 29 is a view showing a current loop at a section (7) in FIG. 21;

FIG. 30 is a view showing a current loop at a section (8) in FIG. 21;

FIG. 31 is a view showing a current loop at a section (9) in FIG. 21;

FIG. 32 is a view showing a time period in which there arises a transient state resulting from the switching of a switch in FIG. 9;

FIG. 33 is a view showing a "dead-shorting" phenomenon in which a switch is rendered from an ON to an OFF state and an associated switch from an OFF to an ON state;

FIG. 34 is a view showing an early timing at which an ON-to-OFF transfer is effected so as to solve a dead-shortening occurs;

FIG. 35 is a view showing a delaying timing at which an OFF-to-ON transfer is effected so as to solve the dead-shorting;

DETAILED DESCRIPTION OF THE INVENTION

The embodiment of the present invention will be explained below with reference to the accompanying drawing.

Figure 1:
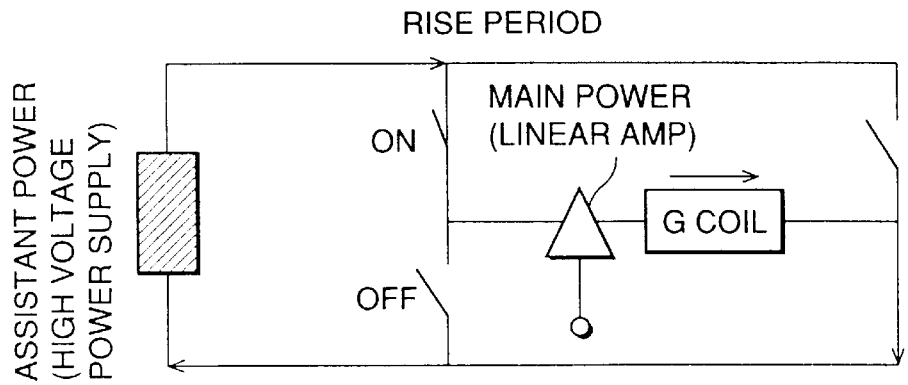
FIG. 1 is a view showing an arrangement of a gradient magnetic field generation apparatus of first prior art and a switching in a rise period.
Figure 2:
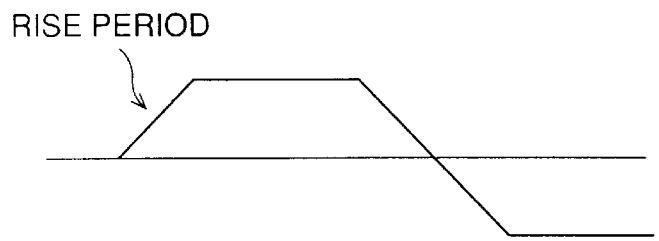
FIG. 2 is a view showing a rise period of a gradient magnetic field.
Figure 3:
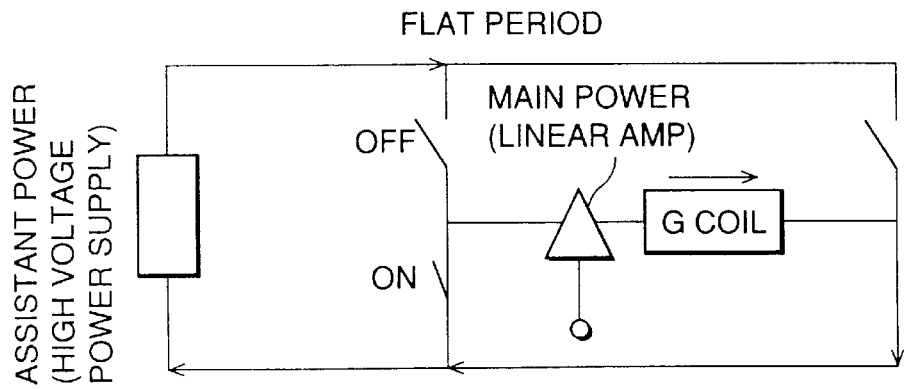
FIG. 3 is a view showing the arrangement of the gradient magnetic field generation apparatus of first prior art and a switching in a flat period.
Figure 4:
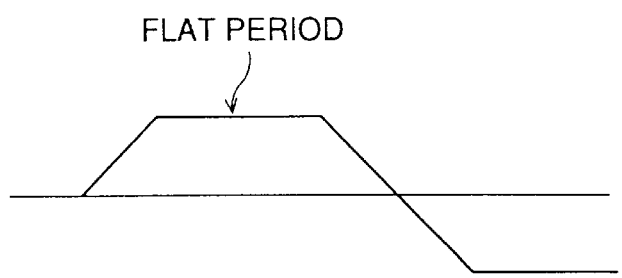
FIG. 4 is a view showing the flat period of the gradient magnetic field.
Figure 5:
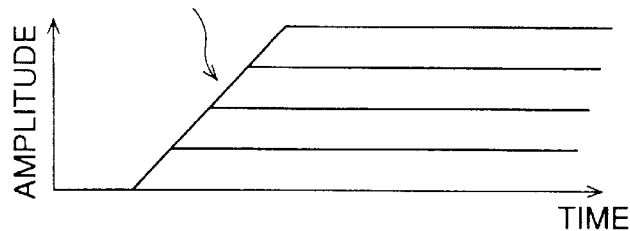
FIG. 5 is an explanatory view showing constant slew rate control.
Figure 6:
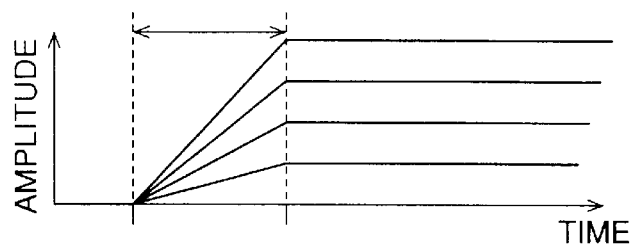
FIG. 6 is an explanatory view showing constant rise time control.
Figure 7:
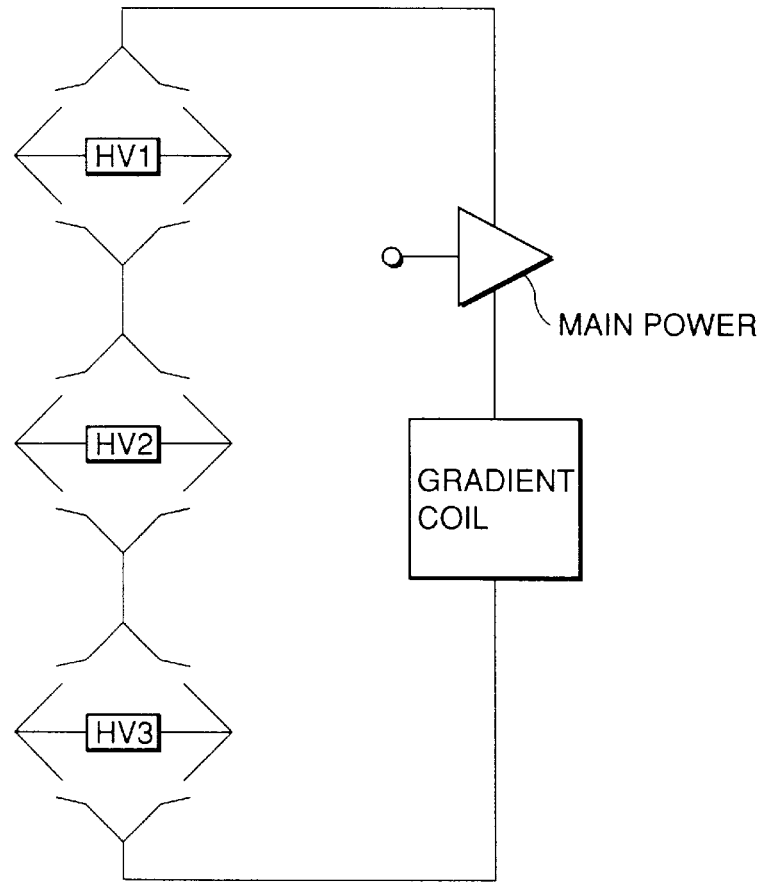
FIG. 7 is a view showing a gradient magnetic field generation apparatus of second prior art.
Figure 8:
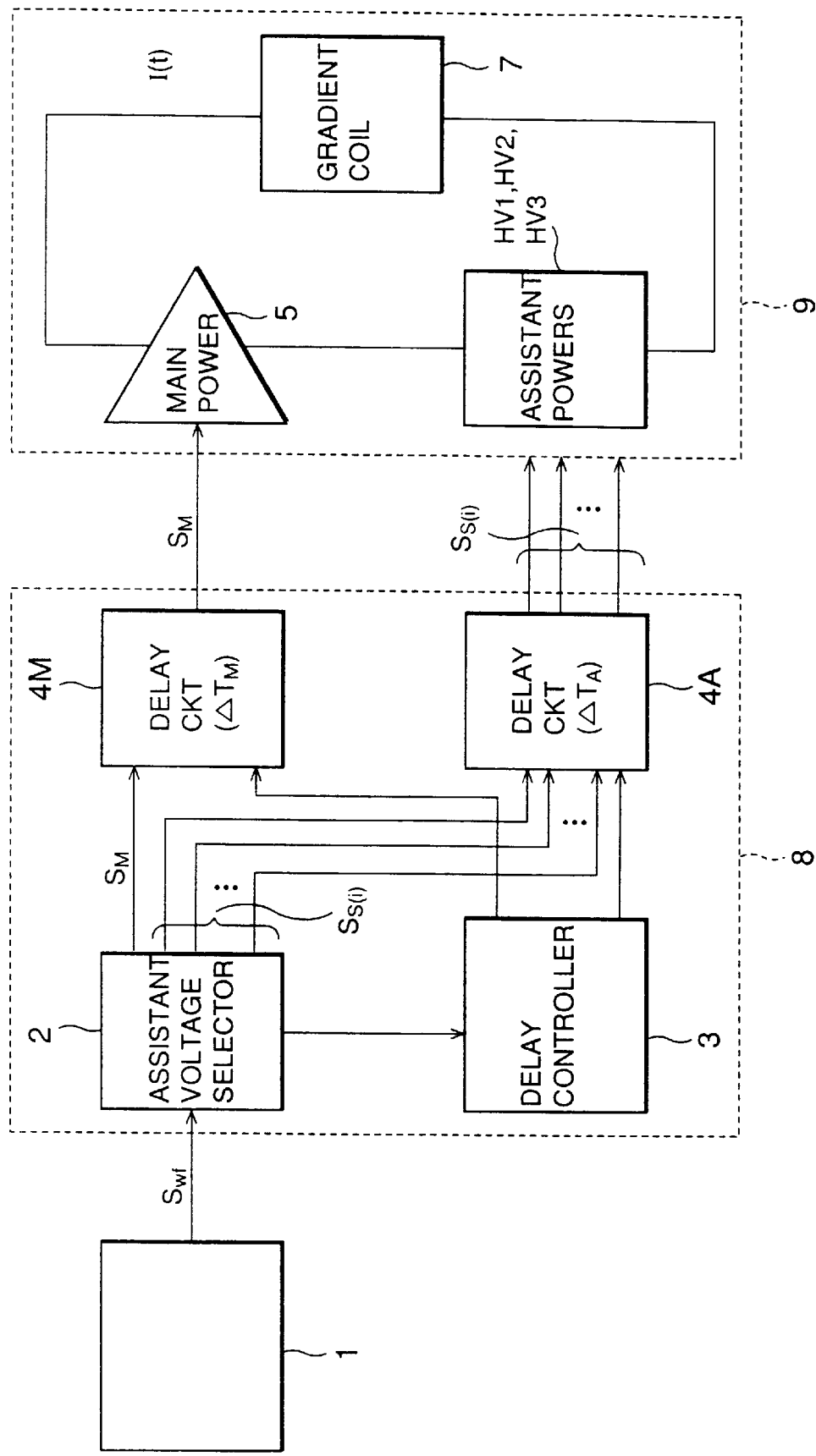
FIG. 8 is a schematic view showing a gradient magnetic field generation apparatus according to a first embodiment of the present invention.
Figure 9:
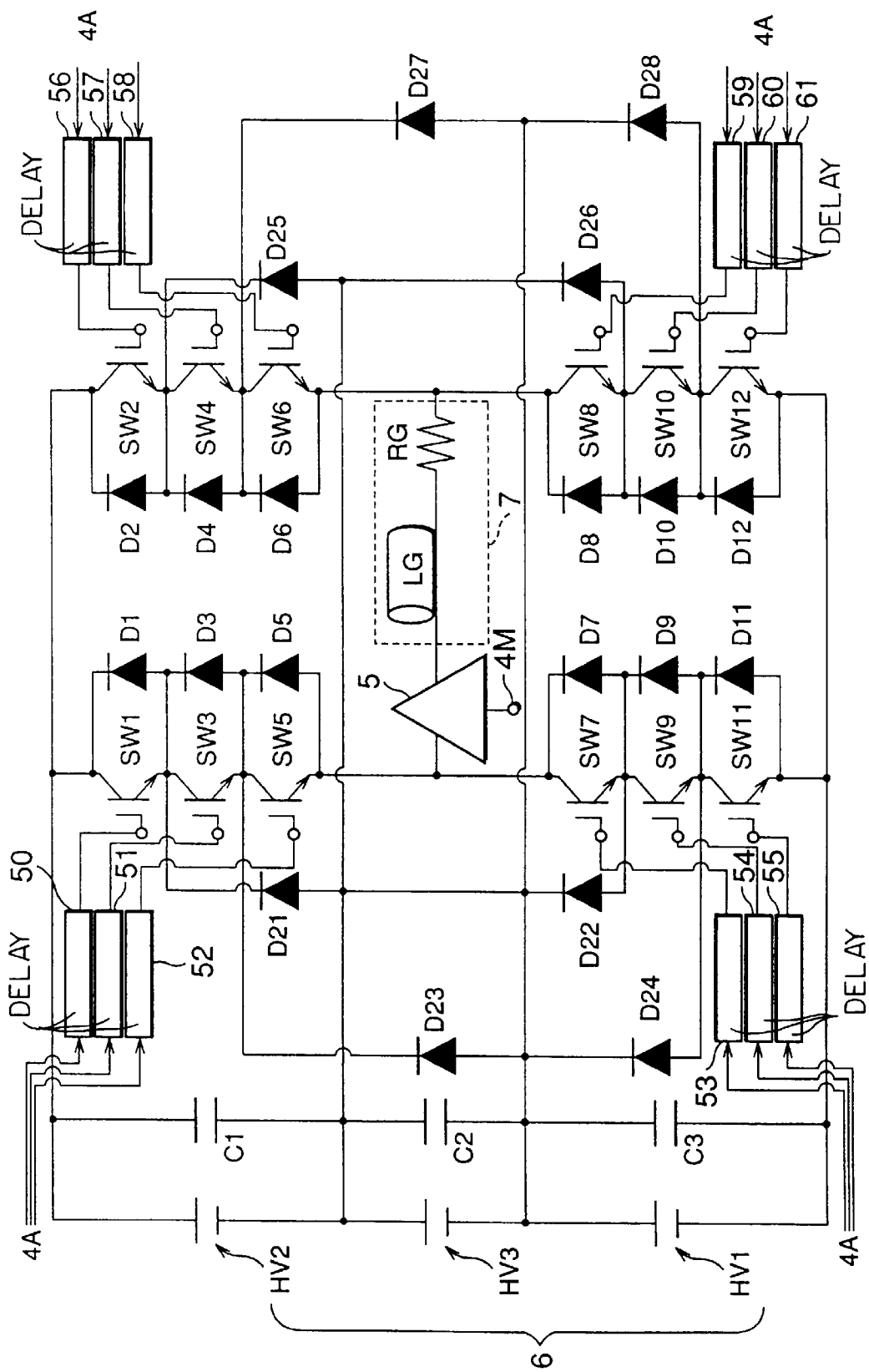
FIG. 9 is a circuit arrangement showing a gradient coil device of FIG. 8.
Figure 11:
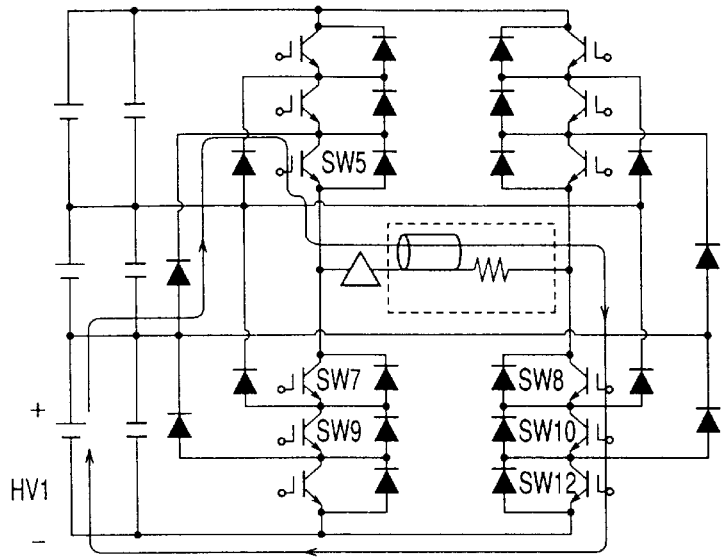
FIG. 11 is a view showing a current loop in a B mode in FIG. 10.
Figure 12:
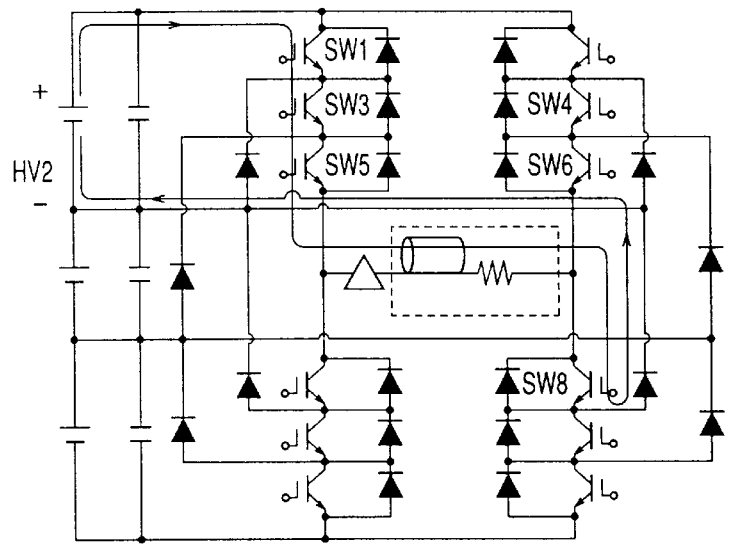
FIG. 12 is a view showing a current loop in a C mode in FIG. 10.
Figure 13:
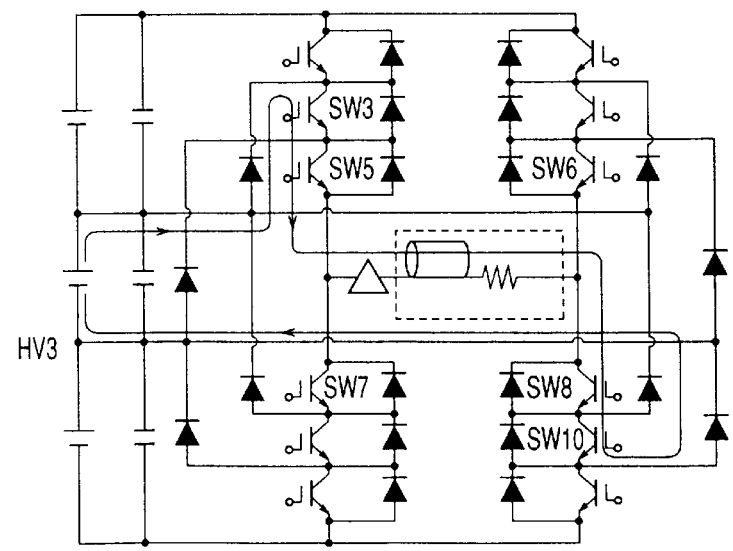
FIG. 13 is a view showing a current loop in a D mode in FIG. 10.
Figure 14:
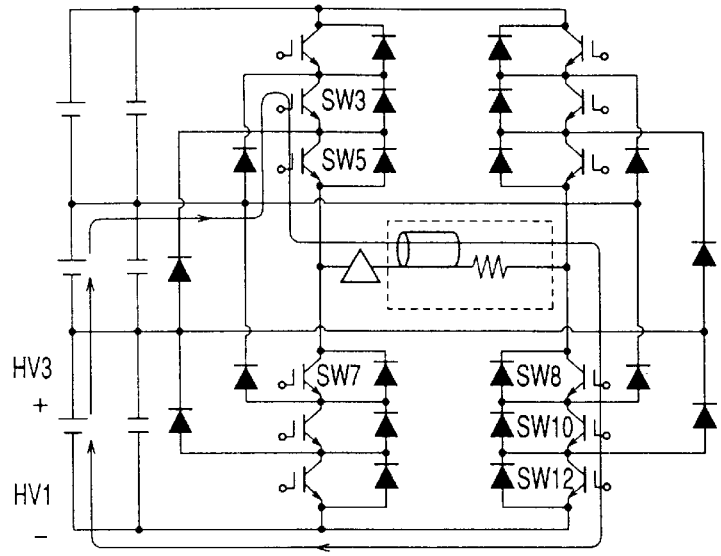
FIG. 14 is a view showing a current loop in E, F and G modes in FIG. 10.
Figure 15:
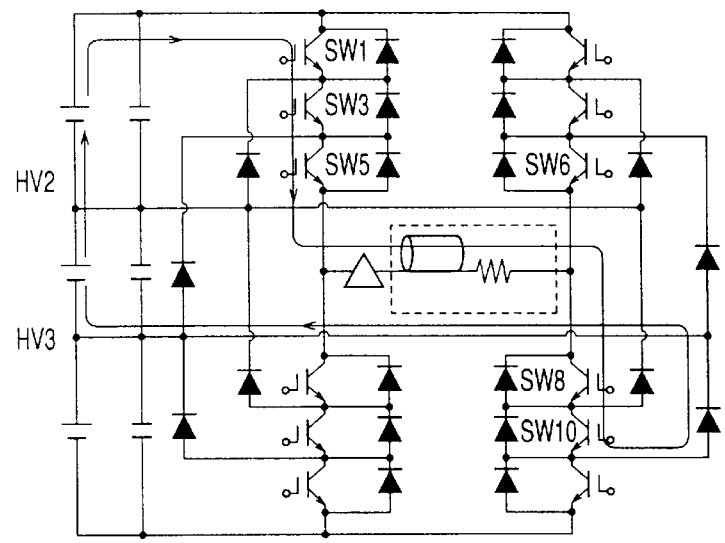
FIG. 15 is a view showing a current loop in an F mode in FIG. 10.
Figure 16:
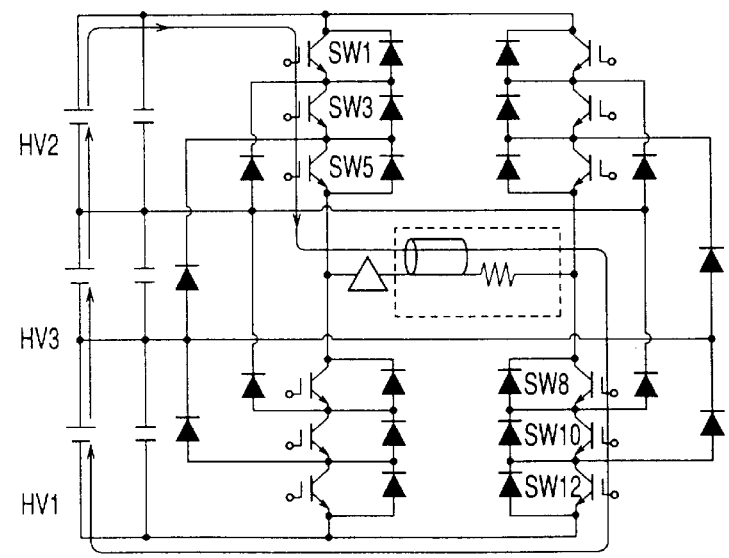
FIG. 16 is a view showing a current loop in a G mode in FIG. 10.

FIG. 8 shows an embodiment of the present invention. FIG. 9 shows a circuit diagram of a gradient coil apparatus. The gradient magnetic generation apparatus comprises a controller 8 and a gradient coil apparatus 9. The gradient coil apparatus 9 comprises a gradient coil 7, a main power 5 connected in series with the gradient coil 7 and serving as a linear amplifier, three assistant powers (high voltage generation devices) HV1, EV2, HV3 cascade-connected to stepwise vary the assistant voltages, semiconductor switches SW1 to SW12 and diodes D1 to D12 and D21 to D28.

The above circuit arrangement is of such a type as to decide whether or not the main power 5 is assisted by any of the assistant powers HV1, HV2, HV3, by varying a combination of the gradient coil 7, main power supply 5, assistant powers HV1, HV2, HV3, semiconductor switches SW1 to SW12, diodes D21 to D28 and turned-ON switches SW1 to SW12, or to vary a combination of the assistant powers HV1, HV2, HV3 or to freely vary the polarities of the assistant powers HV1, HV2 and HV3 with respect to the gradient coil 7.

The controller 8 is so provided as to control the gradient coil apparatus 9 in accordance with a waveform signal $S_{Wf}$ from a sequencer 1 and comprises an assistant voltage selector 2, a delay circuit 4M associated with the main power 5, a delay circuit 4A associated with the assistant powers 5, and a delay controller 3 for controlling these delay times of the delay circuits 4M, 4A.

For the constant rise time control, the assistant voltage selector 2 calculates (estimates) a coil current (target current) $I_{flat}$ at a rise period end time point on the basis of an initial part of a waveform signal $S_{Wf}$ from the sequencer 1. The assistant voltage selector 2 decides an assistant voltage necessary to raise the coil current in the gradient coil 7 up to a calculated target current value I in a predetermined rise time $T_{rise}$. A voltage actually applied to the gradient coil is a total of the output voltages of the main power 5 and assistant power 6.

The assistant voltage selector 2 allows a waveform signal $S_{Wf}$ which comes from the sequencer 1 to pass in a straight way, or to be corrected if required, and supplies it to the delay circuit 4. The assistant voltage selector 2 supplies switch control signals $S_{S(i)}$ relative to the switches SW1 to SW12 to the delay circuit 4A in accordance with a combination of the assistant powers HV1, HV2, HV3 necessary to output a decided assistant voltage.

The delay circuit 4M delays a waveform signal $S_M$ from the assistant voltage selector 2 by an amount corresponding to a first delay time $\Delta T_M$ and supplies the delayed waveform signal $S_M$ to the main power 5. The delay circuit 4A delays the switch control signal $S_{S(i)}$ from the assistant voltage selector 2 by an amount corresponding to a second delay time $\Delta T_A$ and supplies the delayed switch control signals $S_{S(i)}$ to the switches SW1 to SW12.

The delay controller 3 controls the first delay time $\Delta T_M$ of the delay circuit 4M and second delay time $\Delta T_A$ of the delay circuit 4A as will be set out below.

The output voltages $V_{HV1}$, $V_{HV2}$, $V_{HV3}$ of the assistant voltages HV1, HV2 and HV3 are so set as to have a relation of $V_{HV1}<V_{HV2}<V_{HV3}$. The $V_{HV1}$, $V_{HV2}$, $V_{HV3}$ are set under the following conditions in accordance with a maximum output voltage of the main power 5.

The main power 5 can produce an output in a range of "$-V_{amp}$ to $+V_{amp}$" but all the range is not used. That is, it is necessary to leave any reserve power "$\alpha$" so that it can be used for fine adjusting an eddy compensation, etc. Therefore, any substantive output voltage of the main power 5 is restricted within a range "$-(V_{amp}-\alpha)$ to $+(V_{amp}-\alpha)$".

Based on this range, the output voltage difference "$V_{HV2}-V_{HV1}$" between the assistant powers HV1 and HV2 and the output voltage difference "$V_{HV3}-V_{HV2}$" between the assistant powers HV3 and HV2 are so determined as to be set, respectively, below $2\times(V_{amp}-\alpha)$, preferably $2\times(V_{amp}-\alpha)$. Assuming that, for example, $V_{amp}$ is 300V and $\alpha$ is 50V, the output voltages $V_{HV1}$, $V_{HV2}$, $V_{HV3}$ of the assistant powers HV1, HV2, HV3 are set to, for example, 500V, 1,000V, 1,500V, respectively. By determining the $V_{HV1}$, $V_{HV2}$, $V_{HV3}$ under such conditions, a voltage can be applied to the gradient coil 7, without involving any gap, within a range of -3,000V to +3,000V.

The gradient coil apparatus 9 has the above-mentioned main power 5, assistant powers HV1, HV2, HV3, gradient coil 7, semiconductor switches SW1 to SW12, and diodes D21 to D28, as well as a plurality of (here three) capacitors C1 to C3 and delay elements 50 to 61 associated with the switches SW1 to SW12. In order to realize ready switching between the assistant voltages and simplification of the circuit arrangement, the assistant power HV3 of the highest output voltage is sandwiched between the remaining two assistant powers.

Here it is assumed that the a is set to be 50V and the controllable output voltage amplitude of the main power 5 is set to be in a range of -250V to +250V. It is also assumed that the output voltages $V_{HV1}$, $V_{HV2}$, $V_{HV3}$ of the assistant powers HV1, HV2, HV3 are set to be 500V, 1,000V, 1,500V, respectively.

Through a suitable combination of the assistant powers HV1, HV2 and HV3, the assistant voltage can be selected in units of 500V over a range of -3,000V to +3,000V from among 13 combinations in total, the range including 0V. This selection is made by switching 12 switches SW1 to SW12 as shown in FIG. 10. FIGS. 11 to 16 show electric current loops created by the switchings above.

For ease in understanding, the loops of FIGS. 11 to 16 are shown with the numerals attached to the ON switches only.

Figure 17:
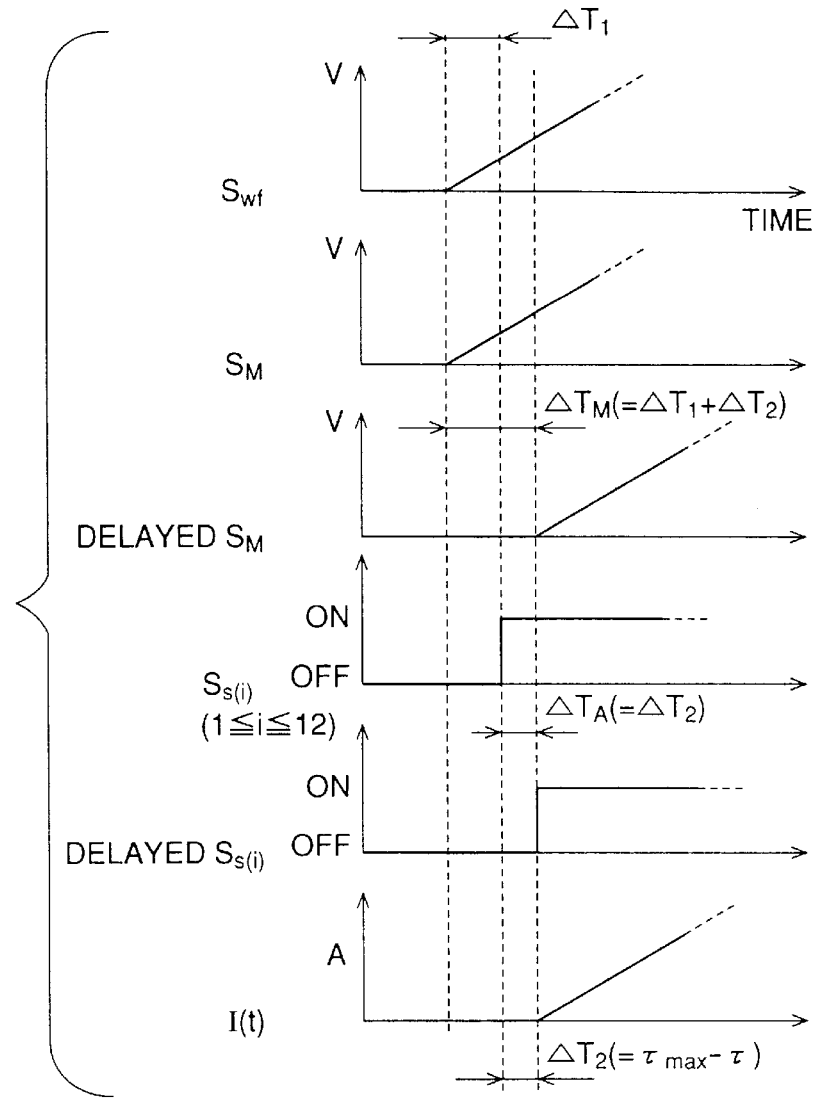
FIG. 17 is a view showing delay times of two delay circuits in FIG. 8.

FIG. 17 is a time chart of the waveform signal $S_{Wf}$ in the rise period, waveform signal $S_M$ relative to the main power 5, delayed waveform signal $S_M$, switch control signal $S_{S(i)}$, delayed switch control signal $S_{S(i)}$, and electric current $I_{(t)}$ in the gradient coil 7.

The waveform signal $S_{Wf}$ from the sequencer 1 is supplied to the assistant voltage selector 2. The waveform signal $S_{Wf}$ rises in a straight line and, past a flat section, decays in a straight line to provide a trapezoidal waveform.

The waveform signal $S_{Wf}$ is supplied, as a waveform signal $S_M$, to the delay circuit 4M through the assistant voltage selector 2. The waveform signal $S_M$ is delayed at the delay circuit 4A by an amount $\Delta T_M$ corresponding to the first delay time and supplied to the main power 5. The main power 5 amplifies the waveform signal $S_M$ in a linear way.

Further, the waveform signal $S_{Wf}$ is analized by the assistant voltage selector 2 as follows.

Figure 18:
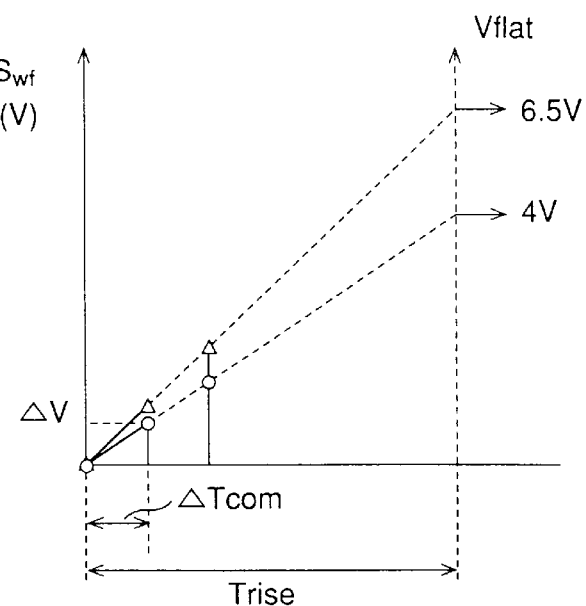
FIG. 18 is an explanatory view showing a method for calculating a rise voltage by a total voltage calculator.

(1) Based on an initial part of the waveform signal $S_{Wf}$, calculation (estimation) is made on a value (target voltage) at a predetermined rise time $T_{rise}$ end time point of the waveform signal $S_{Wf}$. That is, as shown in FIG. 18, the voltage $\Delta V$ of the waveform signal $S_{Wf}$ is sampled after a lapse of a predetermined time $\Delta T_C$ from the start point of the waveform signal $S_{Wf}$. In accordance with the sampled voltage $\Delta V$, the target voltage $V_{flat}$ is calculated based on $$V_{flat} = \Delta V_X \times (T_{rise}/\Delta T_{com})$$

(2) A coil current (target current) $I_{flat}$ flowing in the gradient coil 7 at the predetermined rise time $T_{rise}$ end time point on the basis of the target voltage $V_{flat}$ calculated at (1) above is calculated (estimated), by $$I_{flat} = I_{max} \times (V_{flat}/V_{max})$$

based on a ratio between a maximum value $I_{max}$ of a known coil current capable of flowing in the gradient coil 7 and a target voltage $V_{Wf}$ with respect to the maximum voltage $V_{max}$ in coaction with the main power 5 and assistant power 6.

(3) The rise voltage $V_{rise}$ necessary to raise the current $I_{(t)}$ in the gradient coil 7 up to the target current $I_{flat}$ with the rise time $T_{rise}$ is calculated by $$V_{rise} = L \times (I_{flat}/T_{rise})$$
$$= 10^{-3} \times (I_{flat}/T_{rise}).$$

Assuming that the target current $I_{flat}$ is 300 A and the rise time $T_{rise}$ is 150 $\mu$s, the necessary rise time $V_{rise}$ is 2,000V.

Figure 19:
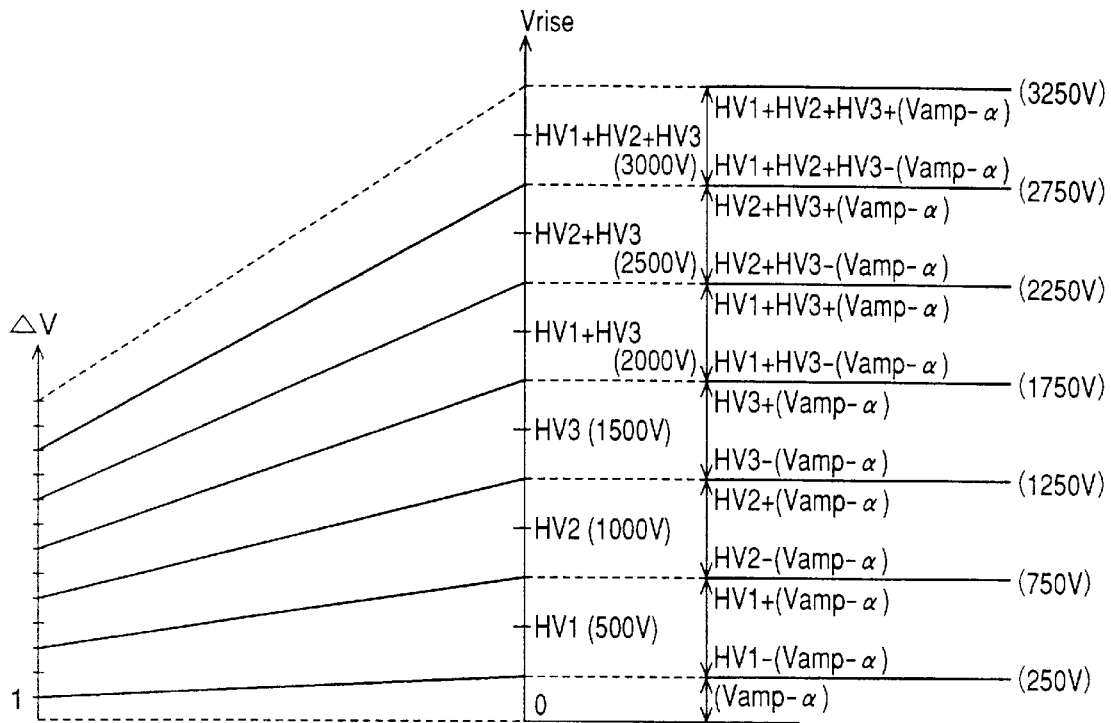
FIG. 19 is a view showing a combination of powers corresponding to a rise voltage by a total voltage calculator in FIG. 8.

(4) In order to raise the summed voltage to the calculated rise voltage $V_{rise}$, any corresponding combination of HV1, HV2 and HV3 is decided. As shown in FIG. 19 it may be possible to initially obtain the results of calculation in (1) to (3) above, store a list of the $\Delta V$ and corresponding combinations of the assistant powers HV1, HV2 and HV3 all in an internal memory and select the combinations of the assistant powers HV1, HV2 and HV3 directly from the $\Delta V$ in the list without the need to calculate them.

(5) A switch control signal $S_{S(i)}$ ($1 \leq i \leq 12$) is prepared so as to assist the main power 5 with the combination of the assistant powers HV1, HV2 and HV3 thus decided.

The switch control signal $S_{S(i)}$ is delayed at the delay circuit 4A by an amount corresponding to a second delay time $\Delta T_A$ and supplied to the switches SW1 to SW12.

The following is an explanation of how the delay time be controlled.

The first delay time $\Delta T_M$ is set to $\Delta T_1 + \Delta T_2$ and the second delay time $\Delta T_A$ is set to $\Delta T_2$. The $\Delta T_1$ is decided to a delay time of the switch control signal $S_{S(i)}$ relative to the "through" waveform signal $S_M$, that is, to a time necessary to decide the assistant voltage. By making the first delay time $\Delta T_M$ longer than the second delay time $\Delta T_A$ by an amount $\Delta T_1$, it is possible to compensate for the delay of a start of the assistant power behind the main power by a time necessary to decide the assistant voltage.

The $\Delta T_2$ shows the delay time of a variation caused by an inadequacy in the frequency characteristic of the main power 5, that is, by a restriction in the frequency band of those linear input and output of the main power 5, and can be decided as will be set out below.

Figure 20:
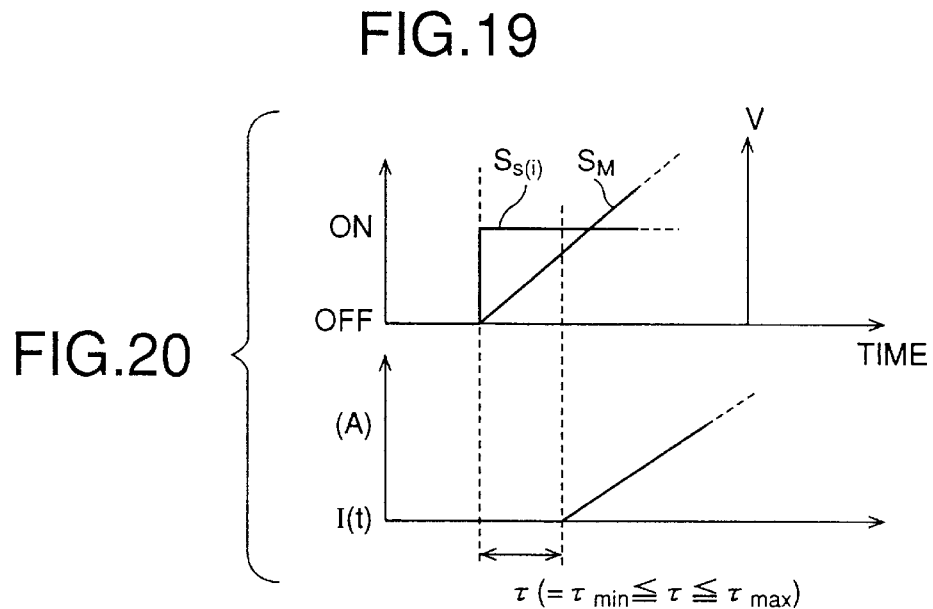
FIG. 20 is a detailed view showing $\Delta T_2$ in FIG. 17.

FIG. 20 shows a delay time $\tau$ from the simultaneous supply of the waveform signal $S_M$ to the main power 5 and the switch control signal $S_{S(i)}$ to the coil apparatus 9 until the coil current I(t) actually starts flowing in the gradient coil 7 from their supply timing. Due to the inadequacy in the frequency characteristic of the main power 5, the delay time $\tau$ varies in a range of $\tau_{min}$ to $\tau_{max}$ depending upon a relation between the output voltage $V_{amp\ flat}$, on one hand, of the main power 5 at the rise time $T_{rise}$ end time point and the assistant voltage on the other.

In order to eliminate this variation and start flowing the current $I_{(t)}$ at all times at a predetermined timing, without starting flowing it at an irregular timing, even if the relation between the output voltage $V_{amp\ flow}$ of the main power 5 and the assistant voltage varies, the $\Delta T_2$ is calculated by $$T_2 = \tau_{max} - \tau$$

with respect to the delay time $\tau$ corresponding to a combination of the actually calculated output voltage $V_{amp\ flat}$ and assistant voltage. That is, the starting of the current $I_{(t)}$ is matched to the maximum delay time $\tau_{max}$.

In this connection, those necessary to calculate the $\Delta T_2$ are the delay time $\tau$ of the current response corresponding to the combination of the main power flat voltage $V_{amp\ flat}$ and assistant voltage. These are initially measured or calculated or stored in a memory means such as a ROM or calculated by predetermined calculation equations.

By adjusting the first delay time $\Delta T_M$ and second delay time $\Delta T_A$, it is possible to simultaneously apply the rise voltage $V_{rise}$ from the main and assistant powers 5 and 6 to the gradient coil 7.

The switching operation of the switches SW1 to SW12 will be explained below. For the EPI method, the gradient magnetic fields are alternately produced.

For ease in understanding, the present embodiment will be explained below as assisting the main power 5 under the assistant power HV1 alone during the rise period and during the decay period.

Figure 21:
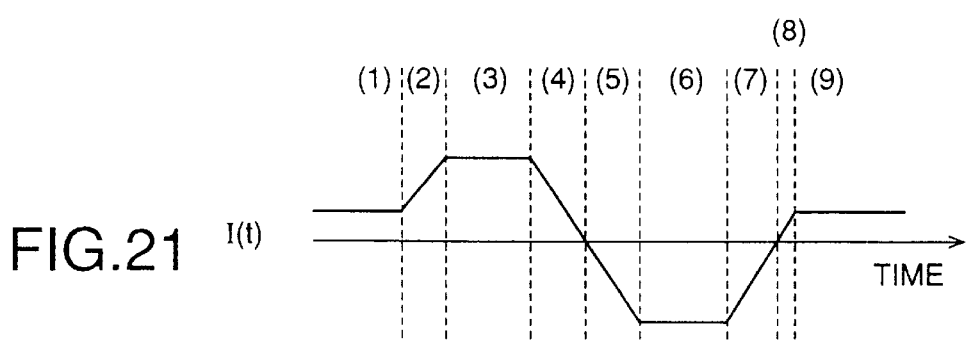
FIG. 21 is a view showing actual electric current in the gradient coil.

FIG. 21 shows a time waveform of the coil current $I_{(t)}$ in the gradient coil 7. Here, explanation will be given below about an offset state section (1) of a very small offset current of a positive polarity flowing before its rise, a positive rise section (2), a positive flat section (3), a decay section (4), a negative rise section (boost section) (5), a negative flat section (6), a positive rise section (8) reaching an offset state and an offset state section (9).

Figure 22:
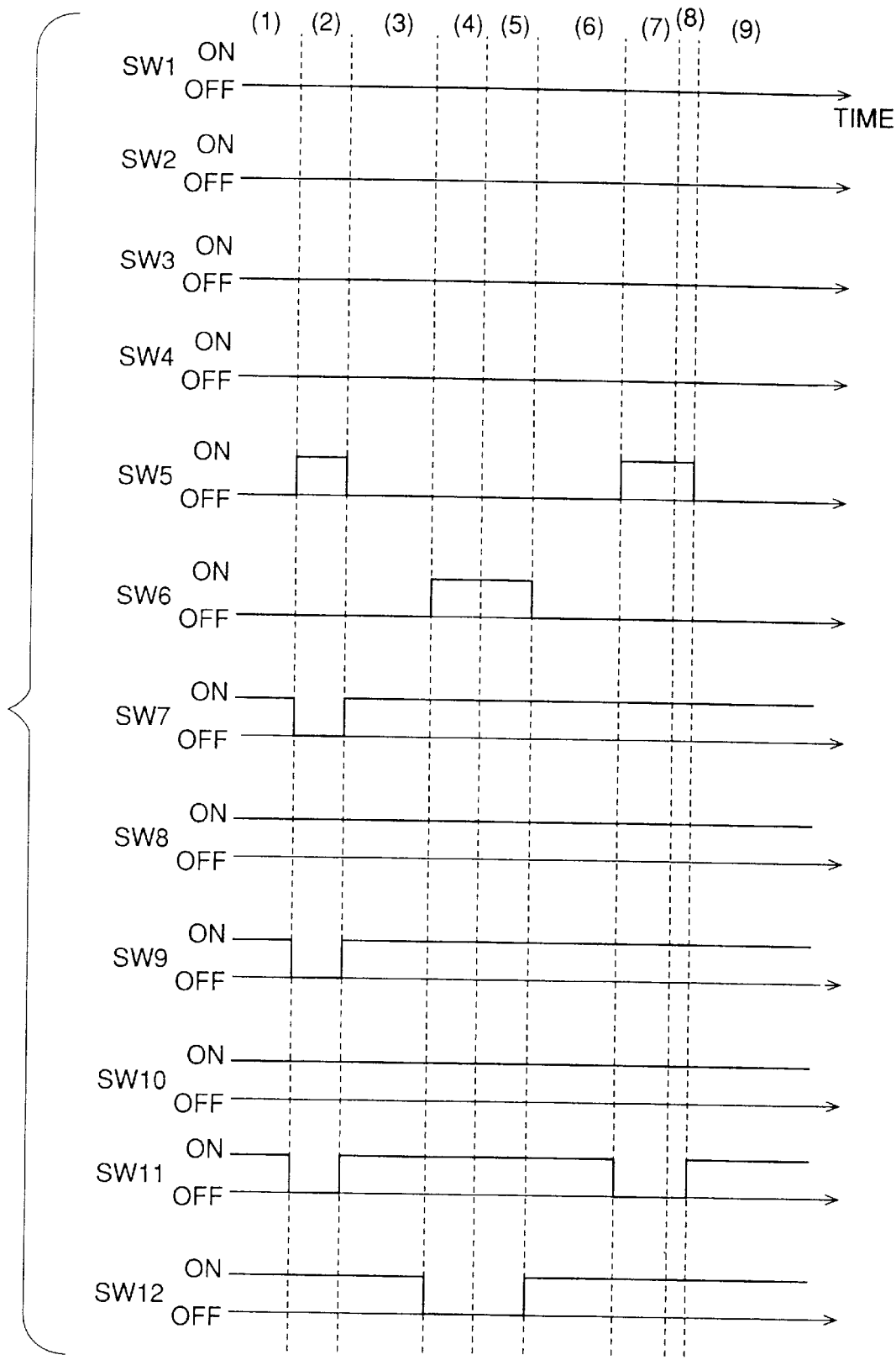
FIG. 22 is a time chart of a switch in FIG. 9.
Figure 23:
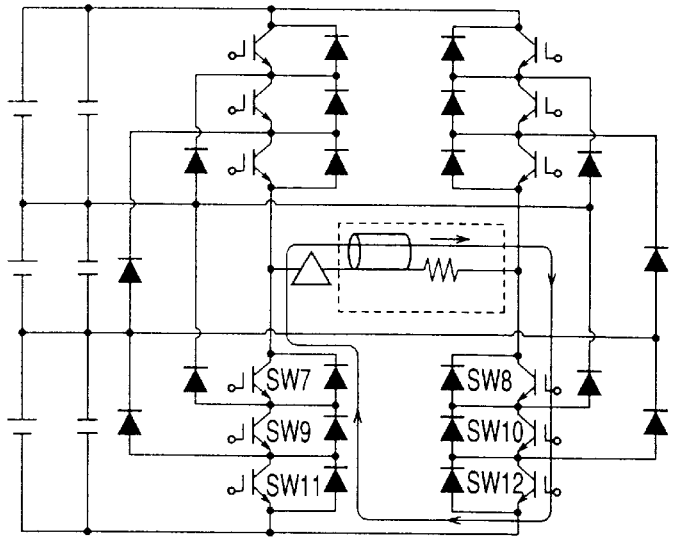
FIG. 23 is a view showing a current loop at a section (1) in FIG. 21.
Figure 24:
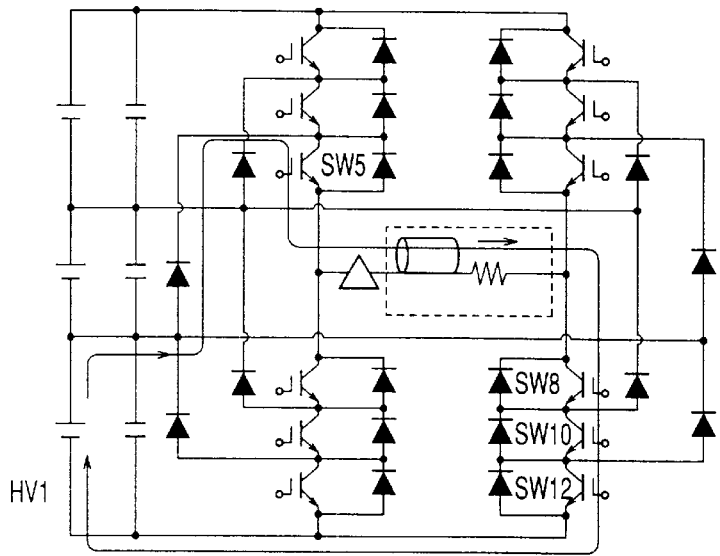
FIG. 24 is a view showing a current loop at a section (2) in FIG. 21.
Figure 25:
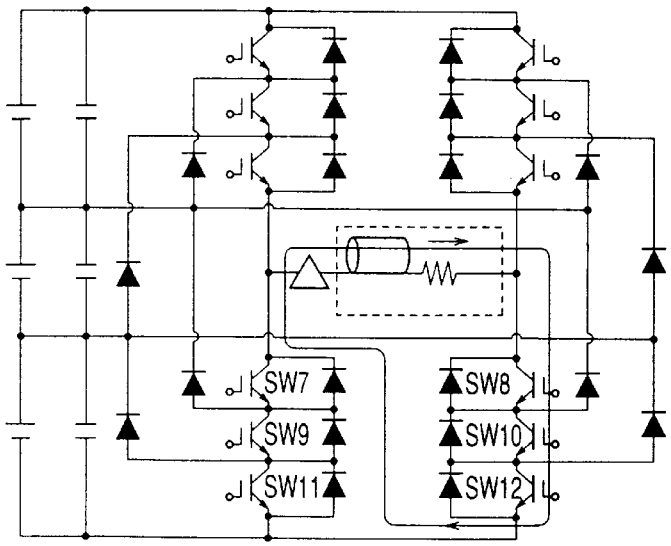
FIG. 25 is a view showing a current loop at a section (3) in FIG. 21.
Figure 26:
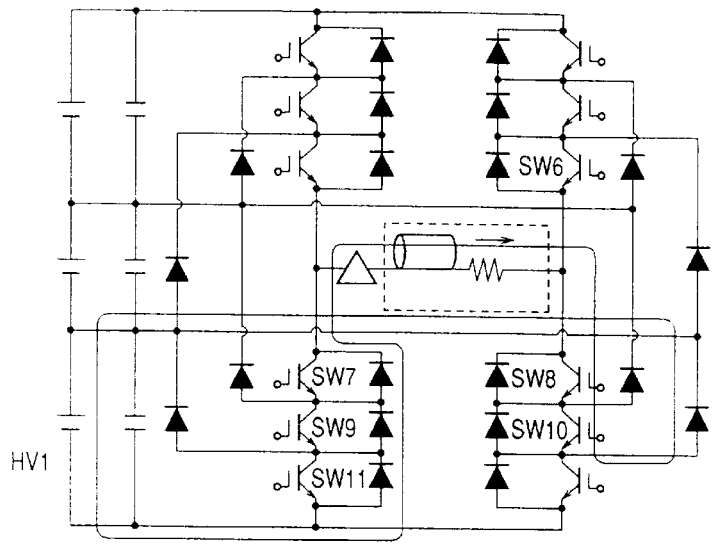
FIG. 26 is a view showing a current loop at a section (4) in FIG. 21.
Figure 27:
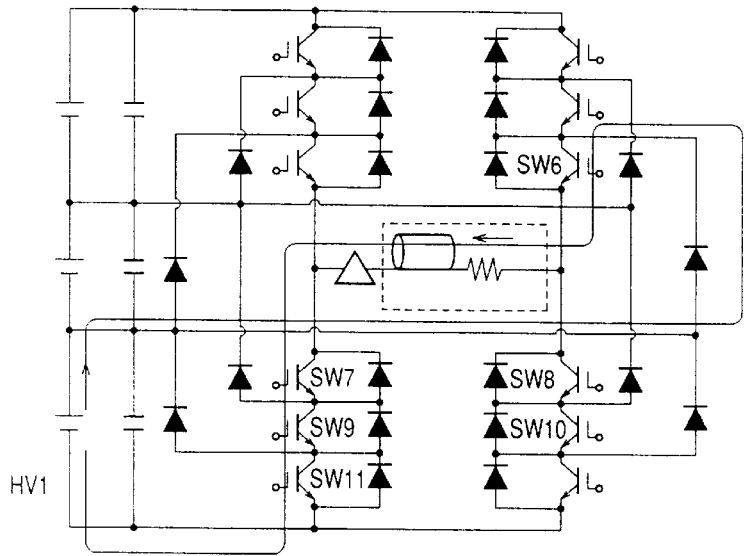
FIG. 27 is a view showing a current loop at a section (5) in FIG. 21.
Figure 28:
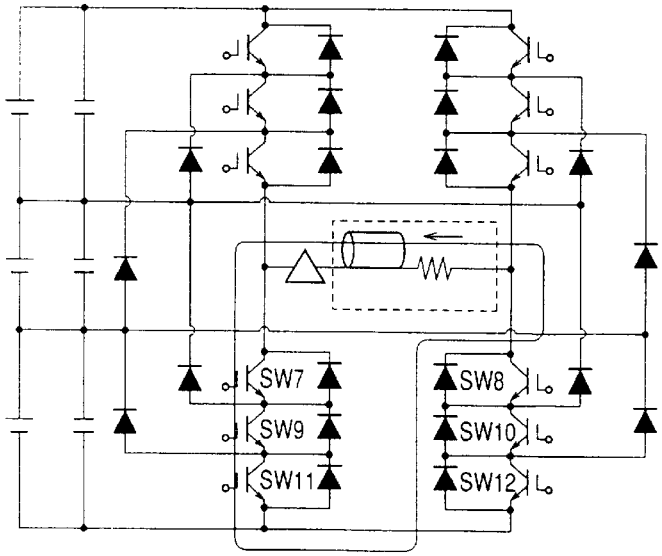
FIG. 28 is a view showing a current loop at a section (6) in FIG. 21.

FIG. 22 shows a time chart of the ON/OFF switchings of the switches SW1 to SW12. FIGS. 23 to 31 show those current loops of the sections (1) to (9) in FIG. 22.

At the section (1), the six switches SW7 to SW12 are turned ON. The reason why those switches SW7, SW9, SW11 not conducive to the creation of the current loop in the section (1) are turned ON is because the electric current can flow in the gradient coil 7 in two directions simply by switching the output polarity of the main current 5 without switching these switches.

At the rise period of the section (2), the switch SW5 is turned ON and the switches SW7, SW9 and SW11 are turned OFF and the ON states of the switches SW8, SW10 and SW12 are maintained from the section (1).

At the flat period of the section (3), through the simply switching of the switch SW5 from an ON to OFF, change can be made from the state in which the main power 5 is assisted under the assistant power to the state in which the gradient coil 7 is driven by the main power 5 alone.

Even in this section (3), those switches SW7, SW9 and SW11 not conducive to the creation of that electric current loop are turned ON in preparation for the next section (4) as in the case of the section (1).

In the decay period of the section (4), through the simply switching of the switch SW12, an energy stored in the gradient coil 7 starts to be regenerated to the assistant power HV1 past the switches SW8 and SW10 and diode D28. At this time, the current loop is created in a route of HV1→D11–D9→D7→main power 5→gradient coil 7→SW8→SW10→D22→HV1.

In this connection, the switches SW7, SW9 and SW11 turned ON in the section (3) are not conducive to the creation of the current loop but they are maintained in an ON state.

In the section (4), those conducive to the creation of the electric current loop are two switches SW8 and SW10. In this state, the circuit is automatically rendered in an OFF state at a point of time when the electric current in the gradient coil 7 becomes zero, so that a smooth transfer can not be made to the negative polarity boost section (5).

In the section (4), those switches SW7, SW9 and SW11 not required in the section (4) are maintained in the ON state, as they are, in preparation for the boost in the subsequent section (5) and, by switching the switch SW6 ON, after the electric current has become a zero, the negative boost of the subsequent section (5) is automatically started without the need to make a switching.

That is, in order that, after the amplitude of the electric current in the gradient coil 7 decays to zero in the section (4), an electric current variation negatively rising from the zero in the section (5) can be done without switching the switching elements SW6, SW7, SW11, the assistant voltage selector 2 effects control under which, in the section (4), not only at least one of those switching elements SW8, SW10 required for the electric current loop in the section (4) but also at least one of the switching elements SW6, SW7, SW9, SW11 required for the electric current loop in the section (5) is previously turned ON.

When the electric current becomes a zero during the decay period of the section (4), a high voltage from the assistant power HV1 is applied through the diode D27 to the gradient coil 7 during the negative rise period of the section (5). The electric current further flows in the main power 5 and is returned past the switches SW7, SW9 and SW11 back to the assistant power HV1. In this connection it is to be noted that the switches involved in the sections (4) and (5) are placed in the same state.

In the flat period of the section (6), with the switch SW6 OFF, a closed loop is created, together with the main power 5 and gradient coil 7, with the use of the switches SW7, SW9, SW11 and D12, D10, D8. By doing so, a negative-side flat top is provided. At this time, in the same way as set out above, the switches SW8, SW10 and SW12 not conducive to the creation of the electric current loop are placed in the ON states in preparation for a subsequent operation.

In the decay period of the section (7), with the switch SW11 OFF, an energy stored in the gradient coil 7 is carried past the switches SW7, SW9 and diode D24 to the assistant power HV1 where the regeneration of the energy is started. At this time, on the negative side of the assistant power HV1, the diodes D12, D10 and D8 are operated. Since, if this state is continued, the circuit becomes automatically inoperative at a point of time when the electric current in the gradient coil 7 becomes zero, if, as in the case set out above, the switch SW5 is placed in the ON state at a point of time when the switch SW11 is turn OFF, an automatic smooth transfer can be made to the next positive boost, without the need for making any switching operation, after the electric current has become zero.

In the section (8), if the electric current becomes zero in the section (7), the assistant power HV1 is applied past the diode D23 to the gradient coil 7. The electric current flows through the main power 5 and is returned back to the assistant power HV1 through the switches SW8, SW10, SW12. In the sections (7) and (8) it is to be noted that the states of the switches involved is the same.

In the last section (9), with the switch SW5 switched OFF, a closed loop is created, together with the main power 5 and gradient coil, with the switches SW8, SW10, SW12 and diodes D11, D9, D7. By doing so it is possible to obtain an offset state.

In the section (9), it is preferable that the switches SW7, SW9 and SW11 not conducive to the creation of the electric current loop be placed in an ON state in preparation for the next operation. Since, with the switches SW7, SW9, SW11, as well as the switches SW8, SW10, SW12, placed in an ON state as set out above, the electric current can be flowed in both directions in accordance with the output of the main power 5 without the need to make any switching operation, the electric current flows without involving any problem even in the case where any overshoot, etc., occurs in the waveform of the eddy compensation circuit, etc., and it is necessary to flow an electric current in a direction temporarily opposite to that of the offset electric current. In this connection it is to be noted that this state is placed in the same state as the flat top already set out above.

Even if the other assistant voltages are to be used, it is possible to effect the high-speed control of the gradient magnetic field by performing switch control corresponding to the assistant voltage as shown in FIG. 10.

Here, during the switching periods of the switches as shown in FIG. 32, one switch is switched from an ON to an OFF state and, in synchronism therewith, another switch is switched from an OFF to an ON state. If the respective switches SW1 to SW12 undergo ideal motions, that is, temporary state changes, then an ON-to-OFF switching and OFF-to-ON switching may be started completely at a time.

In actual practice, on the other hand, the respective semiconductor switches do not undergo any ideal motions as shown in FIG. 33. For example, an IGBT involves a transient response of about 1 $\mu$s and has the characteristic of being longer in transient period at an ON-to-OFF switching time than at an OFF-to-ON switching time. If any ON and OFF control signals are applied at the same time, both the switches will be placed in an ON state and, as looking at the sections (1) and (2) for example, the switch SW11 trying to be switched OFF and switch SW5 trying to be switched ON are both switched ON though being in a very short time period, so that the assistant power HV1 will be dead-shorted.

As shown in FIG. 34, the above-mentioned "dead-shorting" problem can be avoided by starting an ON-to-OFF switching start timing earlier than an OFF-to-ON switching start timing by more than a transient response period at the ON-to-OFF switching time period. This control is realized by outputting the ON-to-OFF switching switch control signal $S_{S(i)}$ earlier than the OFF-to-ON switching switch control signal $S_{S(i)}$ by a time period $\Delta T_{adr}$.

Similarly, as shown in FIG. 35, the above-mentioned "dead-shorting' problem can be avoided by delaying an OFF-to-ON switching start timing behind an ON-to-OFF switching start timing by more than a transient response time period at an ON-to-OFF switching time. This control is realized by outputting the ON-to-OFF switching switch control signal $S_{S(i)}$ from the assistant voltage selector 2 in a way to be delayed $\Delta T_{del}$ behind the OFF-to-ON switching switch control signal $S_{S(i)}$.

The method of FIG. 35 involves the problem of being too late in the actual start of the coil current and the method of FIG. 34 is preferable.

Explanation will be given below about the function of delay circuits 50 to 61 inserted between the switches SW1 to SW12 and the delay circuit 4A. The response characteristics of the switches SW1 to SW12 are not uniform and emerge as a variation in response times. If the variation is too great, it cannot be compensated by the above-mentioned methods of FIGS. 34 and 35. Therefore, measurement is previously made of the response characteristics (response times) of the switches SW1 to SW12 and, using the latest one of their response times as a reference, their time differences are fixedly applied as the delay time to the delay circuit. By doing so, it is possible to eliminate the "dead shorting" problem caused by the above-mentioned variation.

Explanation will be given below about how to handle any large deviation of the response characteristic of the main power (linear amplifier) 5 from the ideal characteristic. As already set out above in more detail, the voltage value applied to the gradient coil 7 during the rise period of the gradient magnetic field is obtained as an added output voltage value of the assistant and main power 5. If, at this time, the bandpass of the main power 5 is adequately broad and ideal, the input waveform is completely similar to the output waveform. In the case where there is a larger deviation from the ideal characteristic, a problem arises with the linear error of the rise waveform and delay time with respect to the input waveform. Therefore, the first method is by broadening the bandpass of the main power 5 with the use of the bandpass broadening technique such as a feedforward. The second method is by subtracting, from the delay time $\Delta T_M$ of the delay circuit 4M, a corresponding delay time.

Further, the delay time characteristics (for example, the relation, etc., of the voltage to the delay time) resulting from the high voltage value and linear amplifier's characteristic are stored in an internal memory (for example, a ROM) in the delay controller 3 in FIG. 8. With the maximum delay time as a reference for example, the delay controller 3 effects such control as to, in the case of a delay time being smaller than the reference, provide a larger delay time as a difference from the maximum delay time and, in the case of a delay time being larger than the reference, provide a smaller delay time as a difference from the maximum delay time. By doing so, it is possible to maintain a delay time of an eventual output waveform constant. According to the present invention, high accurate waveform control can be achieved even in the case where there is a greater deviation from the ideal characteristic of the linear amplifier.

The present invention is not restricted to the above-mentioned embodiment and various changes or modifications of the present invention can be made without departing from the spirit and scope of the present invention.

Figure 36:
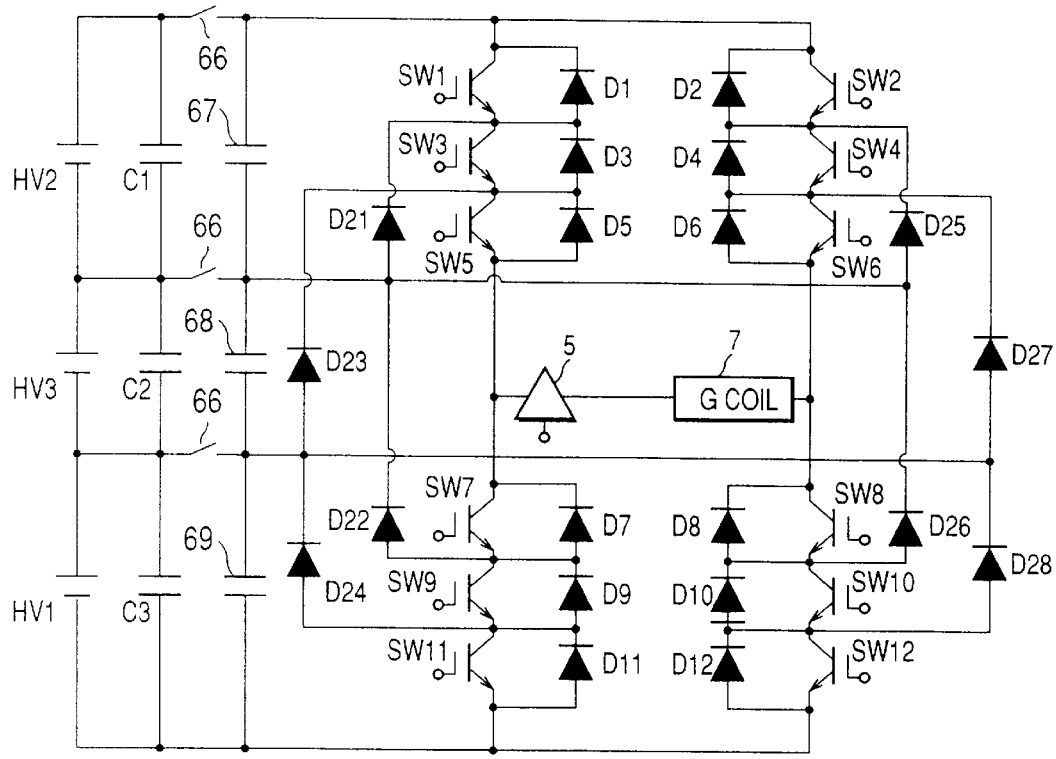
FIG. 36 is a view showing a modification of the gradient coil device in FIG. 9.

In addition to the operation method of the embodiment, the assistant power elements are controlled while being switched more minutely, so that it is possible to provide a waveform output with respect to the input waveform of any sinusoidal waveform and spiral waveform. In this case, however, it is to be noted that the frequency to be responded is restricted by the switching speed, etc., of the above-mentioned powers. If a still higher speed sinusoidal waveform, etc., is required, resonant capacitors 67 to 69 are connected in parallel with assistant powers HV1, HV2, HV3 through corresponding switches 66 and, at a boost time, the resonant capacitors 67 to 69 is used in place of the assistant powers HV1, HV2 and HV3 as shown in FIG. 36. By doing so, it is possible to more accurately output the sinusoidal waveform and spiral waveform. By doing so, it is possible to more accurately output the sinusoidal waveform and spiral waveform.

Figure 37:
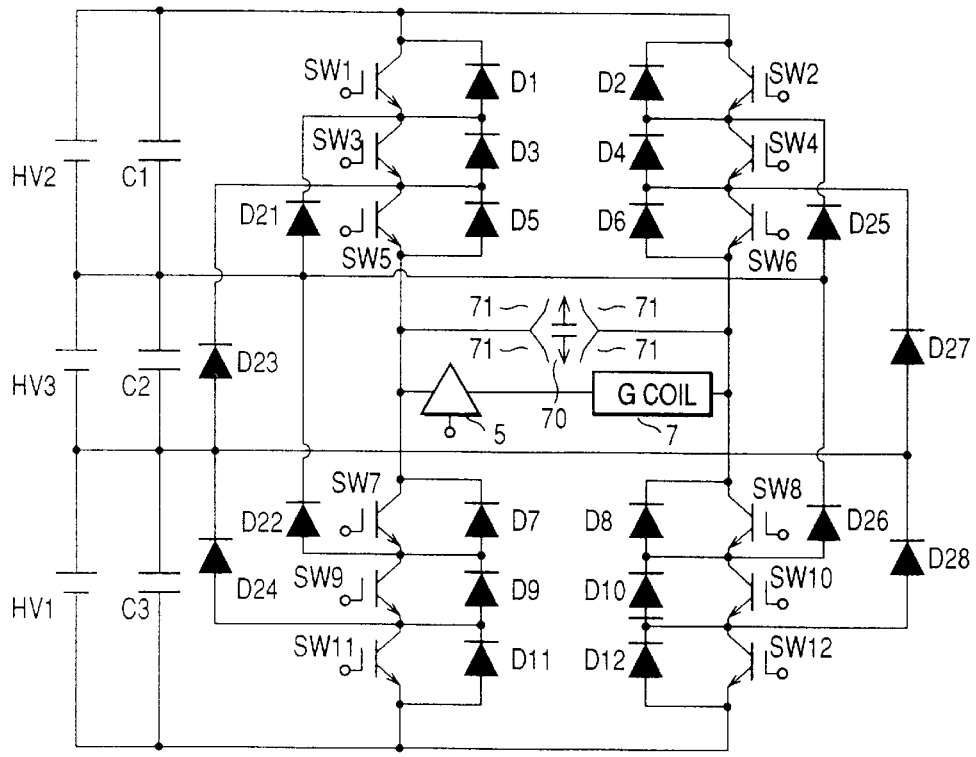
FIG. 37 is a view showing another modification of the gradient coil device.

As shown in FIG. 37, it may be possible to connect a resonant capacitor 70 in parallel with a gradient coil 7 and main power 5 through a bridge-like switch 71.

Further, the voltage distribution ratio of the assistant power elements and voltage distribution of the main power may not necessarily as set out above and the voltage value of the main power 5 upon the switching of the assistant power elements may be non-symmetrical in its distribution array on the positive and negative sides.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A gradient magnetic field generation apparatus adapted to be used in a magnetic resonant imaging apparatus for obtaining internal information of a to-be-examined subject through the utilization of a magnetic resonance phenomenon and adapted to generate a gradient magnetic field in accordance with an input waveform signal which is supplied from a sequencer of the magnetic resonance imaging apparatus, comprising:

a gradient coil;

means for generating first and second control signals in accordance with the input waveform signal;

a delay circuit for delaying the first control signal by a first delay time;

a delay circuit for delaying the second control signal by a second delay time;

a main power for amplifying the delayed first control signal and variably applying a voltage to the gradient coil;

an assistant power for generating an assistant voltage for assisting the main power in accordance with the delayed second control signal; and delay control means for individually controlling the first delay time and second delay time.

2. The apparatus according to claim 1, further comprising means for deciding the assistant voltage necessary for the gradient magnetic field to rise in a predetermined time period in accordance with an initial part of the input waveform signal, wherein, in order to start the main and assistant powers synchronously, the delay control means sets the first delay time to be longer than the second delay time by a time required to decide the assistant voltage.

3. The apparatus according to claim 1, wherein the delay control means individually sets the first and second delay times so as to start the main and assistant powers synchronously.

4. The apparatus according to claim 1, wherein the delay control means sets the first delay time longer than the second delay time so as to start the main and assistant powers synchronously.

5. The apparatus according to claim 1, further comprising means for deciding the assistant voltage necessary for the gradient magnetic field to rise in accordance with an initial part of the input waveform signal, the generation of the gradient magnetic field being delayed from the input waveform signal, by a delay time varying in association with a combination of an output voltage of the main power with an assistant voltage of the assistant power, wherein, in order to generate the gradient magnetic field after a predetermined time period from the input waveform signal, the delay control means sets a base time of the first delay time and that of the second delay time to a difference between a delay time corresponding to a combination of the output voltage of the main power with the decided assistant voltage of the assistant power and a maximum time of the varying delay time.

6. The apparatus according to claim 1, further comprising means for deciding the assistant voltage necessary for the gradient magnetic field to rise for a predetermined time period in accordance with an initial part of the input waveform signal, the generation of the gradient magnetic field being delayed from the input waveform signal by a delay time varying in association with a combination of the output voltage of the main power with an assistant voltage of the assistant power, wherein, in order to generate the gradient magnetic field after a predetermined time period from the input waveform signal, the delay control means sets a base time of the first delay time and that of the second delay time in accordance with a combination of the output voltage of the main power with the decided assistant voltage of the assistant power.

7. The apparatus according to claim 1, further comprising means for deciding the assistant voltage necessary for the gradient magnetic field to rise in a predetermined time period in accordance with an initial part of the input waveform signal, the generation of the gradient magnetic field being delayed from the input waveform signal by a delay time varying in association with a combination of the output voltage of the main power with an assistant voltage of the assistant power, wherein, in order to suppress a variation in a generation timing of the gradient magnetic field, the delay control means sets a base time of the first delay time and that of the second delay time in accordance with a combination of the output voltage of the main power with the decided assistant voltage of the assistant power.

8. The apparatus according to claim 1, further comprising means for deciding the assistant voltage necessary for the gradient magnetic field to rise for a predetermined time period in accordance with an initial part of the input waveform signal, the generation of the gradient magnetic field being delayed from the input waveform signal by a delay time varying in association with a combination of the output voltage of the main power with the assistant voltage of the assistant power, wherein, in order to start the main power and assistant power in a synchronized way, the delay control means sets the first delay time to be longer than the second delay time by a time necessary to decide the assistant voltage and, in order to generate the gradient magnetic field after a predetermined time from the input waveform signal, sets a base time of the first delay time and that of the second delay time to a difference between a delay time corresponding to a combination of an output voltage of the main power with the determined assistant voltage of the assistant power and a maximum time of the varying delay time.

9. A gradient magnetic field generation apparatus adapted to be used in a magnetic resonance imaging apparatus for obtaining internal information of a to-be-examined subject through the utilization of a magnetic resonance phenomenon and adapted to generate a gradient magnetic field in accordance with an input waveform signal supplied from a sequencer of the magnetic resonance imaging apparatus, comprising:

a gradient coil;

a main power for variably applying a voltage to the gradient coil in accordance with the input waveform signal;

a plurality of assistant powers each generating an assistant voltage for assisting the main power, the assistant voltage being varied in a step-like manner in accordance with a corresponding combination with the assistant powers;

a plurality of switches provided for changing the combination of the assistant powers;

means for generating control signals for supply to the switches, there being a variation in the response times of the switches to the control signals; and at least one delay element provided at least one of the switches so as to compensate for the variation.

10. The apparatus according to claim 9, wherein the delay time is of such a type that a delay time is set based on a maximum one of those response times of the switches.

11. The apparatus according to claim 9, wherein the delay element is so set that the delay time corresponds to a difference between a maximal one of those response times of the switches and these individual response times.

12. A gradient magnetic field generation apparatus adapted to be used for a magnetic resonance imaging apparatus for obtaining internal information of a to-be-examined subject through the utilization of a magnetic resonance phenomenon and adapted to generate a gradient magnetic field in accordance with an input waveform signal supplied from a sequencer of the magnetic resonance imaging apparatus, comprising:

a gradient coil;

a main power for variably applying a voltage to the gradient coil in accordance with the input waveform signal;

a plurality of assistant powers each generating an assistant voltage for assisting the main power, the assistant voltage being varied in a step-like manner in accordance with a combination of these assistant powers;

a plurality of switches provided for varyinga combination of the assistant powers; and means for generating a plurality of control signals relative to the switches, the switches being placed in an OFF state when the control signal is at a first level and in an ON state when the control signal is at a second level, wherein when a first one of the plurality of switches is switched from an OFF to an ON state and a second switch is switched from an ON to OFF state in synchronism with the first switch, the control signal generating means delays a timing for changing the control signal relative to the first switch from a first to a second level behind a timing for changing the control signal relative to the second switch from the second level to the first level.

13. The apparatus according to claim 12, wherein the control signal generating means delays the timing for changing the control signal relative to the first switch from the first to the second level behind the timing for changing the control signal relative to the second switch from the second to the first level by a time at least longer than the response time of the switch.

14. The apparatus according to claim 12, wherein the control signal generating means changes the control signal relative to the first switch from the first to the second level at a reference time and the control signal relative to the second switch from the second to the first level earlier than the reference time.

15. The apparatus according to claim 12, wherein the control signal generating means changes the control signal relative to the second switch from the second level to the first level at a reference time and the control signal relative to the first switch from the first level to the second level at a time later than the reference time by the response time of the switch.

16. The apparatus according to claim 12, wherein the switch is of a semiconductor type.

17. A gradient magnetic field generation apparatus adapted to be used for a magnetic resonance imaging apparatus capable of obtaining internal information of a to-be-examined subject through the utilization of a magnetic resonance phenomenon and adapted to generate a gradient magnetism in accordance with an input waveform signal supplied from a sequencer of the magnetic resonance imaging apparatus, comprising:

a gradient coil;

a main power for variably applying a voltage to the gradient coil in accordance with an input waveform signal;

a plurality of assistant powers each generating an assistant voltage for assisting the main power; and a plurality of switches constituting, together with the assistant powers, a bridge circuit which includes the gradient coil and the main power as center elements the switches being selectively turned ON and combined to select an assistance and no assistance of the main power by the assistance powers, to change a level of the assistant voltage and to select polarity of the assistant voltage.

18. The apparatus according to claim 17, further comprising voltage clamp diodes provided for corresponding switches.

19. The apparatus according to claim 17, further comprising a plurality of diodes so arranged as to flow electric current from the main power into the gradient coil in both directions when specific ones of the plurality of switches are turned ON.

20. The apparatus according to claim 17, wherein a circuit including the gradient coil, assistant powers and switches is so configured as to, while maintaining specific ones of the plurality of switches in an ON state without the need for switching these switches, shift the gradient magnetic field phase from a decaying state and to a rising state in an opposite direction.

21. The apparatus according to claim 17, wherein a circuit including the gradient coil, assistant powers and switches is so configured as to assist the main power under at least one of the assistant powers and to shift the gradient magnetic field phase from a rising state, after cutting off the assistant power from the gradient coil, to a state in which the main power alone drives the gradient coil, said state being achieved simply by switching at least on of those specific switches OFF.

22. A gradient magnetic field generation apparatus adapted to be used for a magnetic resonance imaging apparatus capable of obtaining internal information of a to-be-examined subject through the utilization of a magnetic resonance phenomenon and adapted to generate a gradient magnetism in accordance with an input waveform signal supplied from a sequencer of the magnetic resonance imaging apparatus, comprising:

a gradient coil;

a main power for variably applying a voltage to the gradient coil in accordance with an input waveform signal;

a plurality of assistant powers each generating an assistant voltage for assisting the main power, assistant voltages of the assistant powers being different from each other; and a plurality of switches constituting, together with the assistant powers, a bridge circuit which includes the gradient coil and the main power as center elements.

23. An apparatus according to claim 22, wherein a difference in the assistant voltages of the assistant powers is determined as $2\times(V_{amp}-\alpha)$ or smaller, where $V_{amp}$ represents an output voltage of the main power and $\alpha$ represents a reserve power of the main power.

* * * * *